(12) United States Patent
Boutami et al.

(10) Patent No.: US 11,048,046 B2
(45) Date of Patent: Jun. 29, 2021

(54) OPTICAL COUPLER PROVIDED WITH A STRUCTURATION

(71) Applicant: Commissariat à l'énergie atomique et aux énergies alternatives, Paris (FR)

(72) Inventors: Salim Boutami, Grenoble (FR); Mickaël Brun, Eybens (FR); Pierre Labeye, Grenoble (FR); Sergio Nicoletti, Sinard (FR); Grégory Maisons, Marcoussis (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 201 days.

(21) Appl. No.: 14/904,809

(22) PCT Filed: Jul. 11, 2014

(86) PCT No.: PCT/EP2014/064994
§ 371 (c)(1),
(2) Date: Jan. 13, 2016

(87) PCT Pub. No.: WO2015/007664
PCT Pub. Date: Jan. 22, 2015

(65) Prior Publication Data
US 2016/0170147 A1    Jun. 16, 2016

(30) Foreign Application Priority Data

Jul. 15, 2013   (FR) ........................................ 1356953

(51) Int. Cl.
*G02B 6/293* (2006.01)
*G02B 6/124* (2006.01)
(Continued)

(52) U.S. Cl.
CPC ......... *G02B 6/29331* (2013.01); *G02B 6/124* (2013.01); *G02B 6/14* (2013.01); *G02B 2006/12147* (2013.01)

(58) Field of Classification Search
CPC ............ G02B 6/29331; G02B 6/29334; G02B 6/29335
(Continued)

(56) References Cited

U.S. PATENT DOCUMENTS 6,097,865 A * 8/2000 Alferness ........... G02B 6/12007
                                                    385/129
6,236,782 B1 * 5/2001 Kewitsch ........... G02B 6/02114
                                                    385/37
(Continued)

FOREIGN PATENT DOCUMENTS

WO   WO 03/054596   7/2003

OTHER PUBLICATIONS

"A hybrid AlGaInAs—Silicon Evanescent amplifier" by Park et al, IEEE Photonics Technology Letters, vol. 19, No. 4, pp. 230-232, 2007.*

(Continued)

*Primary Examiner* — Robert Tavlykaev
(74) *Attorney, Agent, or Firm* — B. Aaron Schulman, Esq.

(57) ABSTRACT

The invention relates to an optical coupler (10) in a vertical configuration, capable of working for a wavelength and comprising a first waveguide (12) and a second waveguide (14). The second waveguide (14) has a patterning (33) in the form of a series of patterns (36), the patterns (36) extending along a transverse direction (X) perpendicular to the longitudinal direction (Z), being parallel to each other and orthogonal to the general direction of the first waveguide (12), each pattern (36) being arranged both in the core (30)

(Continued)

and the cladding (32) of the second waveguide (14) and having parameters influencing the evanescent wave coupling between the first waveguide (12) and the second waveguide (14), said parameters being chosen such that the coupling (C) is greater than 15%.

13 Claims, 7 Drawing Sheets

(51) Int. Cl.
G02B 6/14 (2006.01)
G02B 6/12 (2006.01)
(58) Field of Classification Search
USPC .......................... 385/28, 30, 37, 42
See application file for complete search history.

(56) References Cited

U.S. PATENT DOCUMENTS

| 6,713,866 | B2* | 3/2004 | Simon | H01L 31/024 257/714 |
|---|---|---|---|---|
| 6,931,180 | B2* | 8/2005 | Madsen | G02B 6/1228 385/49 |
| 7,457,491 | B2* | 11/2008 | Chen | H05K 1/0274 257/722 |
| 2002/0181875 | A1 | 12/2002 | Lauzon et al. | |
| 2004/0037512 | A1* | 2/2004 | Cho | G02B 6/42 385/88 |
| 2006/0171635 | A1* | 8/2006 | Lee | G02B 6/125 385/50 |
| 2007/0058900 | A1* | 3/2007 | Faccio | G02F 1/3132 385/37 |
| 2009/0016399 | A1* | 1/2009 | Bowers | B82Y 20/00 372/50.21 |
| 2010/0142580 | A1* | 6/2010 | Gilet | H01S 5/026 372/50.11 |
| 2011/0194804 | A1 | 8/2011 | Mary et al. | |
| 2011/0299561 | A1 | 12/2011 | Akiyama | |

OTHER PUBLICATIONS

"Refractive indexes of (Al, Ga, In)As epilayers on InP for optoelectronic applications" by Mondry et al, IEEE Photonics Technology Letters, vol. 4, No. 6, pp. 627-629, 1992.*

Wikipedia article "Evanescent field", available online since at least 2006.*

International Search Report for PCT/EP2014/064994 dated Sep. 24, 2014.

Office Action dated Oct. 5, 2017 in corresponding European Patent Application No. 2014739416.

Bock, et al., "Subwavelength grating periodic structures in silicon-on-insulator: a new type of microphotonic waveguide", Sep. 13, 2010, pp. 1-12, vol. 18, No. 19, Optics Express 20262.

* cited by examiner

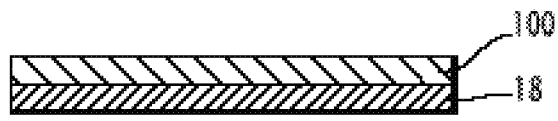
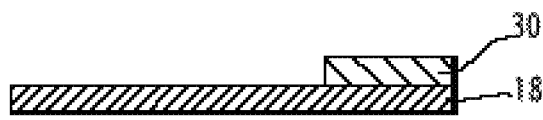
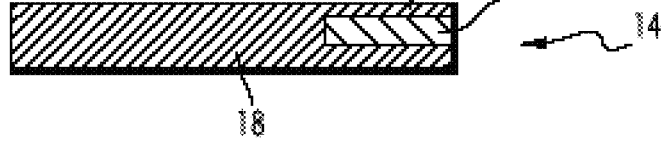
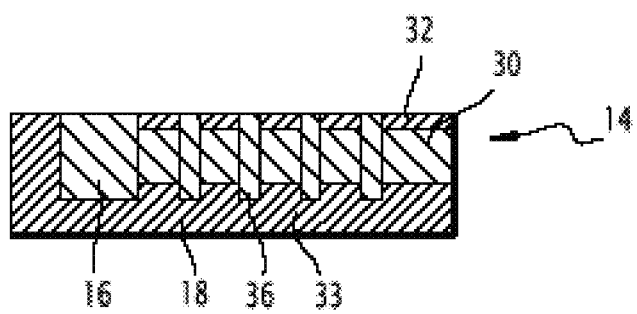
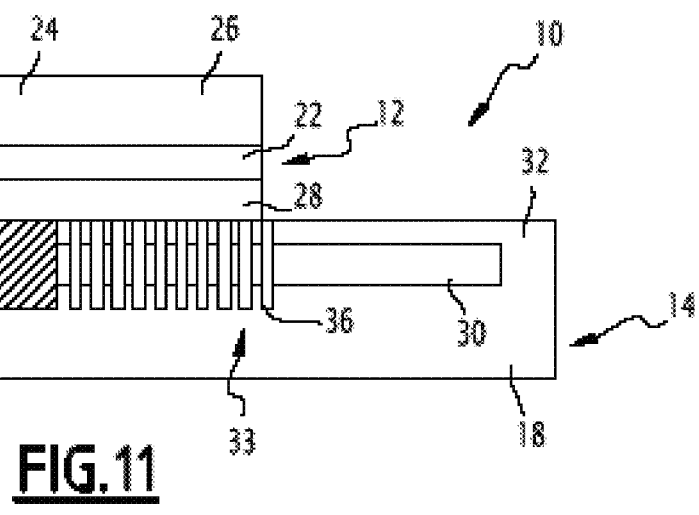

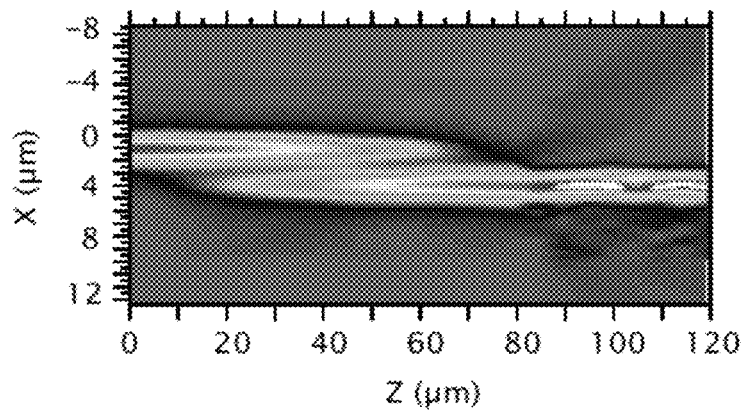
FIG.12
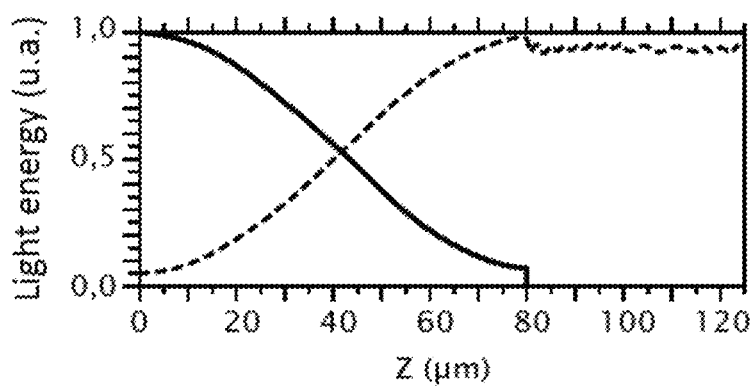
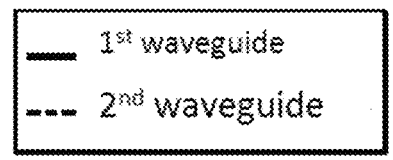
FIG.13

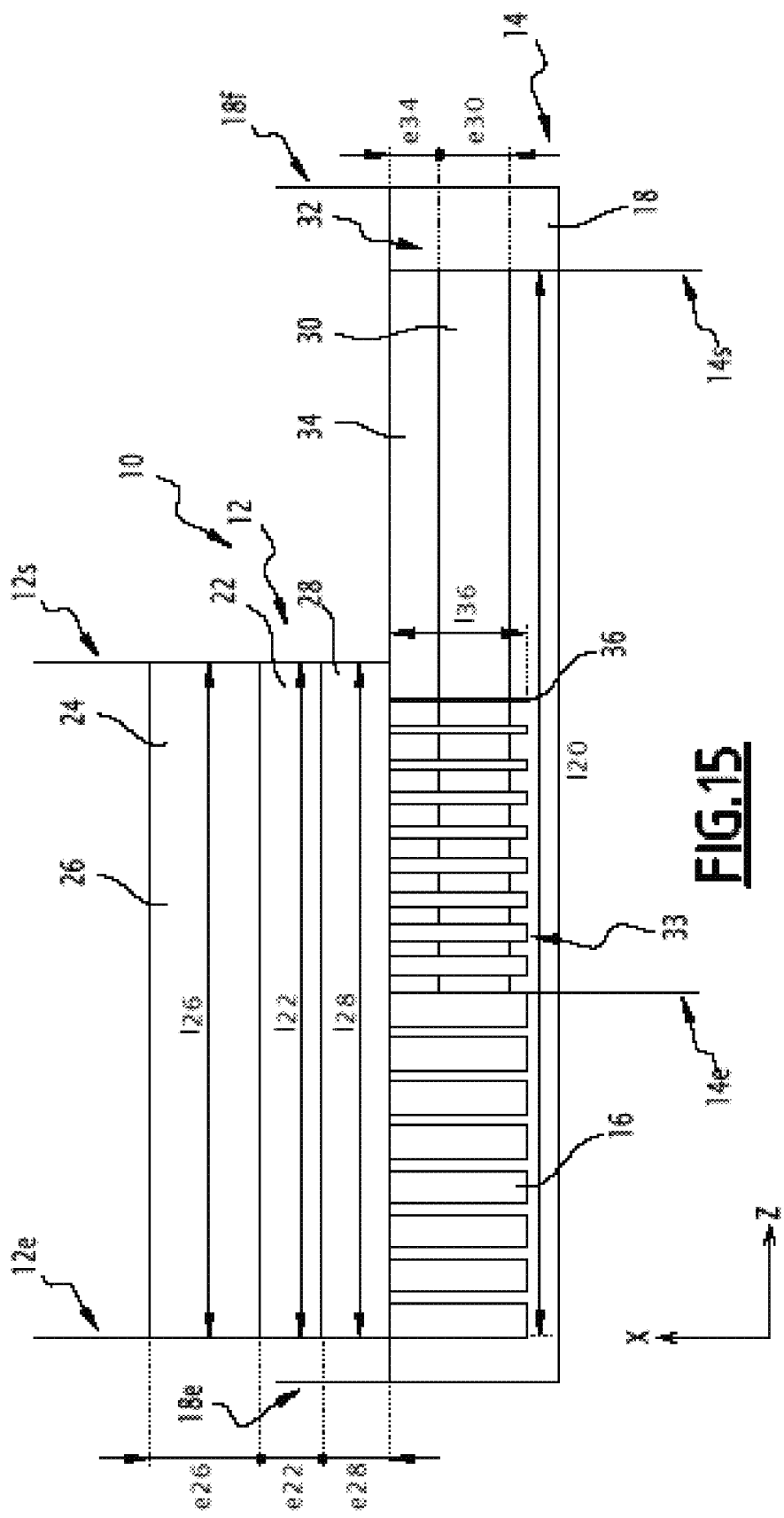

OPTICAL COUPLER PROVIDED WITH A STRUCTURATION

FIELD OF THE INVENTION

The present invention relates to an optical coupler, a component comprising such an optical coupler, a determination method, and a method for manufacturing such an optical coupler.

BACKGROUND OF THE INVENTION

The invention is situated in the field of the heterogeneous integration of laser sources on an integrated optical structure. Such integrations are applicable in various fields using components from integrated photonics. Applications include optical telecommunications, optical sensors and biophotonics. For these different applications, there is a need for structures making it possible to guide the light effectively.

Integrated photonics developed on substrates such as glass, silicon or III-V materials. It will be recalled that a semiconductor of type "III-V" is a composite semiconductor manufactured from one or more elements from column III of the periodic table of elements (boron, aluminum, gallium, indium, etc.) and one or more elements from column V or pnictogens (nitrogen, phosphorus, arsenic, antimony, etc.). It is desirable instead to use silicon substrates, since silicon substrates make it possible to integrate both optical components and electronic components.

However, no monolithic laser source effective on silicon yet exists. To offset this problem, heterogeneous laser source integrations using III-V materials on a silicon substrate are generally used.

To obtain effective coupling of the laser light created by the laser source in the III-V material with a silicon guiding structure, it has been proposed to use evanescent waves to couple a passive waveguide of the silicon guide structure with the laser source. The coupling is related to the ratio between the amplitude of the electric field of the wave circulating in the passive waveguide and the amplitude of the electric field of the wave emitted by the laser source. More specifically, the coupling is defined by formula $C=I2/(I1+I2)$, where C is the coupling, I1 is the intensity of the electric field in the laser, and I2 is the intensity of the electric field in the passive waveguide. Furthermore, it will be recalled that a passive waveguide is a waveguide with no active element.

The obtainment of the coupling between the laser source and the passive waveguide requires that the laser source be very close to the passive waveguide. The coupling in fact greatly depends on the spacing between the laser source and the passive waveguide. This proximity is often difficult to obtain in practice, since the passive waveguide should be protected by depositing an insulating layer degrading the laser source, in particular due to the temperature at which the deposition is done.

To avoid this problem, document WO-A-03/054,596 proposes producing a passive waveguide including an optical relief with gradual efficiency.

However, this type of structure is difficult to produce in a technology involving silicon.

SUMMARY OF THE INVENTION

There is therefore a need for an optical coupler having good coupling efficiency and that is easier to manufacture.

To that end, the invention relates to an optical coupler in a vertical configuration, capable of working for a wavelength and comprising a first waveguide extending in a longitudinal direction and capable of propagating a first propagation mode of the light having a first effective index, a second waveguide distinct from the first waveguide, parallel to the first waveguide, having a core and a cladding and capable of propagating a second propagation mode of the light having a second effective index, the second effective index being different from the first effective index. The second waveguide having a patterning, the patterning having a period along the longitudinal direction below the ratio between the wavelength at which the optical coupler is capable of operating and the product of two by the second effective index, the patterning being in the form of a series of patterns, the patterns extending along a transverse direction perpendicular to the longitudinal direction, being parallel to each other and orthogonal to the general direction of the first waveguide, each pattern having parameters influencing the evanescent wave coupling between the first waveguide and the second waveguide, said parameters being chosen such that the coupling is greater than 15%.

Such an optical coupler makes it possible to obtain better coupling. The optical coupler is easy to manufacture, since only techniques from microelectronics are used.

According to specific embodiments, the optical coupler comprises one or more of the following features, considered alone or according to any technically possible combinations:

- the patterns are chosen from the group consisting of openings formed in the second waveguide and blades.
- the patterns have a dimension along the transverse direction larger than the dimension of the core of the second waveguide along the transverse direction.
- the core of the second waveguide having an optical index, the second effective index is greater than the first effective index and the patterns are made from a material having an optical index below the optical index of the core of the second waveguide.
- the patterning has a fill factor, the patterns are made from a material having an optical index, some parameters influencing the evanescent wave coupling between the first waveguide and the second waveguide being the fill factor of the patterning, the optical index of the material from which the patterns are made, and the spacing along the longitudinal direction between each pattern.
- each pattern is arranged both in the core and the cladding of the second waveguide.
- each waveguide includes a cladding and a core, the optical index of the core of the first waveguide being below the optical index of the cladding of the second waveguide.
- the spacing along the longitudinal direction between the patterns is variable in the longitudinal direction.
- the first waveguide includes a core made from a material belonging to column III of the periodic table formed with a material from column V of the periodic table and two lower and upper layers surrounding the core.
- the core of the second waveguide has a variable dimension in the transverse direction.
- the optical coupler includes a substrate, made from a first material, in which the second waveguide is buried, the first waveguide being arranged in contact with the substrate and formed from a material different from the first material.
- the optical coupler includes a third waveguide distinct from the first and second waveguides and extending parallel to the first and second waveguides, the third waveguide being arranged between the first waveguide and the second waveguide and being capable of propagating a third light propagation mode having a third effective index.

a thermal insulation zone of the first waveguide in which the patterning is arranged.

The invention also relates to an optical component including an optical coupler as previously described.

Furthermore, the present invention also relates to a method for determining an optical coupler in a vertical configuration, capable of working for a wavelength and comprising a first waveguide extending in a longitudinal direction and capable of propagating a first propagation mode of the light having a first effective index, and a second waveguide distinct from the first waveguide, parallel to the first waveguide, having a core and a cladding and capable of propagating a second propagation mode of the light having a second effective index, the second effective index being greater than the first effective index, the second waveguide having a patterning, the patterning having a period along the longitudinal direction smaller than the ratio between the wavelength at which the optical coupler is capable of working and the product of two by the second effective index, the patterning being in the form of a series of patterns having parameters influencing the evanescent wave coupling between the first waveguide and the second waveguide, the patterns extending along a transverse direction perpendicular to the longitudinal direction, being parallel to each other and orthogonal to the general direction of the first waveguide, each pattern having parameters influencing the evanescent wave coupling between the first waveguide and the second waveguide. The method comprises a step for choosing a desired evanescent wave coupling between the first waveguide and the second waveguide, the desired coupling being greater than or equal to 15%, and a step for modifying the parameters of the patterning to obtain the desired evanescent wave coupling between the first waveguide and the second waveguide.

Furthermore, the present invention also relates to a method for manufacturing an optical coupler as previously described, in which the manufacturing method comprises steps for manufacturing waveguides and the patterning involving techniques for deposition, epitaxy, polishing, gluing and material removal by etching.

The manufacturing method makes it possible to obtain the optical coupler previously described using only microelectronics techniques. Such techniques are particularly easy to implement.

BRIEF DESCRIPTION OF THE DRAWINGS

Other features and advantages of the invention will appear upon reading the following description of embodiments of the invention, provided as an example only and in reference to the drawings, which are.

DETAILED DESCRIPTION OF THE PREFERRED EMBODIMENTS

Figure 1:
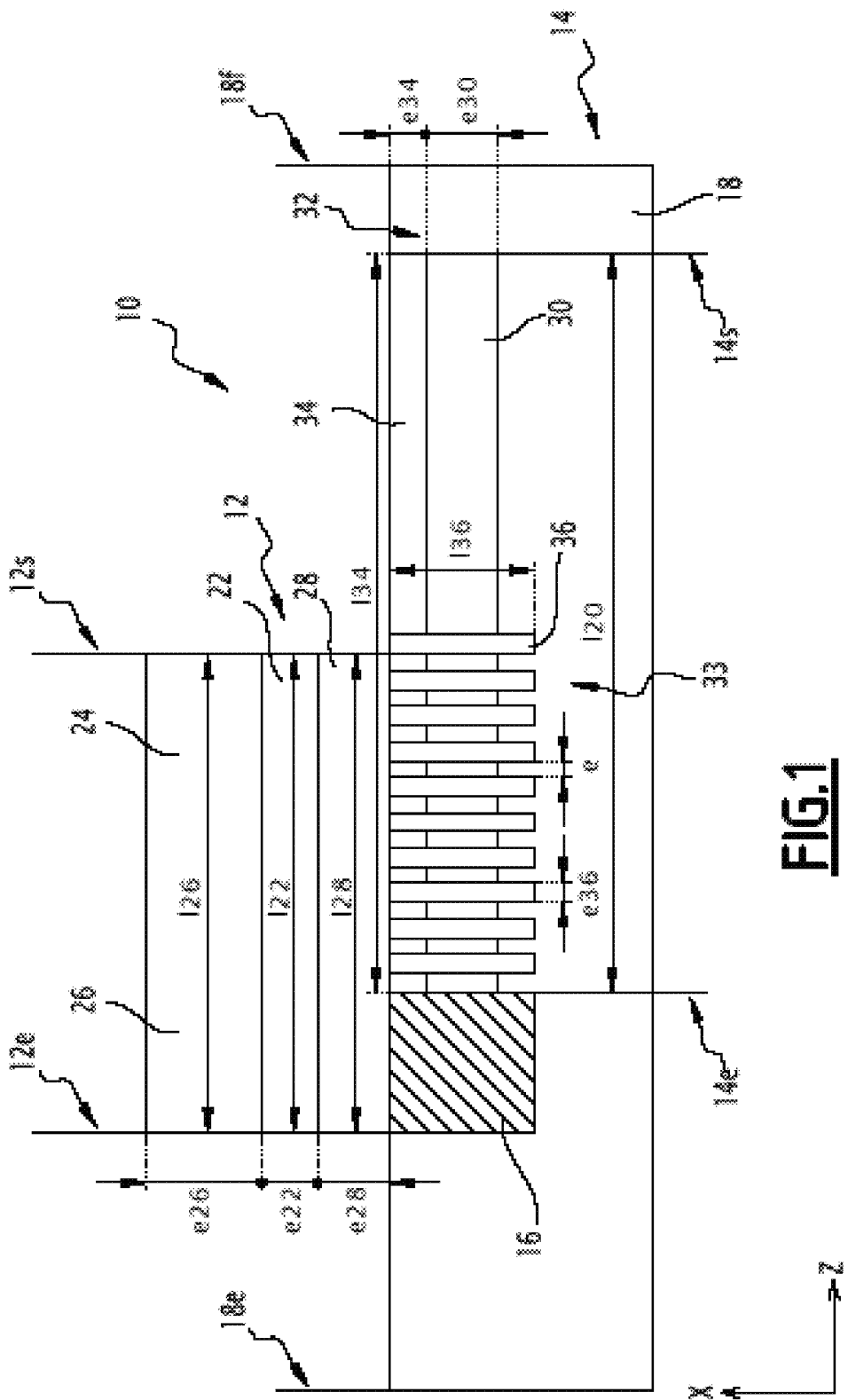
FIG. 1, a diagrammatic cross-sectional view of one example of an optical coupler according to a first embodiment of the invention, FIG. 2, a mapping of the electrical field in the optical coupler according to FIG. 1 during operation, FIG. 3, a graph showing the spatial evolution of the distribution of the coupling in the different waveguides for the optical coupler according to FIG. 1, FIG. 4, a mapping of the electric field in an optical coupler according to the state of the art, FIG. 5, a graph showing the spatial evolution of the distribution of the coupling in the different waveguides for the optical coupler according to the state of the art considered in FIG. 4, FIGS. 6 to 11, diagrammatic cross-sectional illustrations of the element obtained at different stages of the implementation of the method for manufacturing the optical coupler according to the first embodiment illustrated by FIG. 1, FIG. 12, a mapping of the electric field in the optical coupler according to a second embodiment of the invention during operation, FIG. 13, a graph showing the spatial evolution of the distribution of the coupling in the different waveguides for the optical coupler according to FIG. 12, FIG. 14, a diagrammatic cross-sectional view of an example of an optical coupler according to a third embodiment of the invention, and FIG. 15, a diagrammatic cross-sectional view of an example of an optical coupler according to a fourth embodiment of the invention.

In the context of the invention, an optical coupler 10 is provided that is capable of working for a wavelength λ as shown in FIG. 1.

This coupler 10 is in a vertical configuration, i.e., a configuration in which this optical coupler 10 is capable of coupling light between two guides offset in a transverse direction perpendicular to a general propagation direction of the light.

The coupler 10 comprises a first waveguide 12 extending in the longitudinal direction Z and capable of propagating a first propagation mode P1 of the light having a first effective index NF1. In fact, depending on the field distribution, each propagation mode sees a different index of the materials making up the waveguide depending on each propagation mode. The index seen by each propagation mode defines the effective index.

The coupler 10 also comprises a second waveguide 14 distinct from the first waveguide 12. The second waveguide 14 is parallel to the first waveguide 12. The second waveguide 14 has a core 30 and a cladding 32. Furthermore, the second waveguide 14 is capable of propagating a second propagation mode P2 of the light having a second effective index NF2. The second effective index NF2 is different from the first effective index NF1.

The second waveguide 14 has a patterning 33 in the form of a series of patterns 36. The patterning 33 can also be designated using the generic term "grating" 33. However, for clarity reasons, this term is not used in the context of this description, since the patterning 33 is not a diffraction grating. In particular, the patterning 33 does not serve to amplify the field in the gain medium. On the contrary, the patterning 33 makes it possible to extract light by modifying the effective index.

The patterns 36 extend along a transverse direction X perpendicular to the longitudinal direction Z. The patterns are parallel to each other and orthogonal to the general direction of the first waveguide. The patterning 33 has a period P along the longitudinal direction Z below the ratio between the wavelength λ at which the optical coupler 10 is capable of working and the product of two by the second effective index NF2. By definition, the period P is the sum of the spacing between two patterns 36 and the width of a pattern 36.

The patterns 36 have parameters influencing the evanescent wave coupling C between the first waveguide 12 and the second waveguide 14, these parameters being chosen such that the coupling C is greater than 15%.

As a reminder, in the context of the invention, it is chosen to express the coupling as the ratio between the intensity of the electric field of the wave circulating in the second waveguide 14 and the sum of the intensities of the electric fields of the waves circulating in the first waveguide 12 and the second waveguide 14. Hereinafter, the coupling thus defined is denoted "C", which is a number with no unit.

When the first waveguide 12 is supplied with power, the first waveguide 12 emits light in the form of guided waves.

Part of the waves guided in the first waveguide 12 then couples with the second waveguide 14 by evanescent waves. Waves are then guided in the second core 30.

The patterning 33 makes it possible to perform an adaptation of the effective index favoring the coupling between the first waveguide 12 and the second waveguide 14.

This better coupling is obtained while preserving easy manufacturing. In fact, a manufacturing method may be used using only microelectronics techniques. Such a manufacturing method comprises steps for manufacturing waveguides 12, 14 and the patterning 33 involving techniques for deposition, epitaxy, polishing, gluing and material removal by etching.

The patterns 36 are for example openings made in the second waveguide 14. According to the embodiments, these openings have a square or round shape. Alternatively, the openings are in the shape of a slot, the inside of the slot being a vacuum or air.

According to another example, the patterns 36 are blades, as illustrated in FIG. 1.

Preferably, the patterns 36 have a dimension along the transverse direction X larger than the dimension of the core 30 of the second waveguide 14 along the transverse direction X. This property makes it possible to increase coupling.

According to one embodiment, the second effective index NF2 is greater than the first effective index NF1; the patterns 36 are then made from a material having an optical index below the optical index of the core 30 of the second waveguide 14. This makes it possible to obtain better coupling more easily.

When the second effective index NF2 is lower than the first effective index NF1, the patterns 36 are then made from a material having an optical index greater than the optical index of the core 20 of the second waveguide 14. This makes it possible to obtain better coupling more easily.

Advantageously, each parameter characterizing the patterning 33 is a parameter influencing the evanescent wave coupling C between the first waveguide 12 and the second waveguide 14.

Thus, in the case where the patterning 33 has a fill factor F and the patterns 36 are made from a material having an optical index, said parameters influencing the evanescent wave coupling C between the first waveguide 12 and the second waveguide 14 are the fill factor of the patterning 33, the optical index of the material from which the patterns 36 are made, and the spacing e along the longitudinal direction Z between each pattern 36.

Under these conditions, at the first order, the new effective index NF2' of the mode of the guide with patterning is given by NF2'=F*n36+(1−F)*NF2 and the relationship NF2'≈NF1 is also verified.

Preferably, to increase the coupling, the spacing e along the longitudinal direction Z between the patterns 36 is variable along the longitudinal direction Z.

In one particular embodiment, the first waveguide 12 includes a core 22 made from a material belonging to column III of the periodic table formed with a material according to column V of the periodic table and two lower 26 and upper 28 layers surrounding the core 20.

Advantageously, to favor coupling, the core 30 of the second waveguide 14 has a variable dimension along the transverse direction X.

In order to insulate the second waveguide 14 from the environment of the first waveguide 12, according to one advantageous embodiment, the optical coupler 10 includes a substrate 18, made from a first material, in which the second waveguide 14 is buried, the first waveguide 12 being arranged in contact with the substrate 18 and made from a material different from the first material.

In order to increase this insulation effect with respect to the environment, the optical coupler 10 includes a third waveguide distinct from the first and second waveguides 12, 14 and extending parallel to the first and second waveguide 12, 14, the third waveguide being arranged between the first waveguide 12 and the second waveguide 14 and being capable of propagating a third light propagation mode P3 having a third effective index NF3.

According to one alternative, the optical coupler 10 includes a thermal insulation zone of the first waveguide 12 in which the patterning 33 is arranged. This makes it possible to ensure good management of the heat of the first waveguide 12, and in particular to prevent it from heating.

Hereinafter, specific embodiments are described more precisely. This is in particular the case for the optical coupler 10 of FIG. 1.

For the rest of the description, a longitudinal direction is defined corresponding to a general propagation direction of the light. A transverse direction is also defined perpendicular to the longitudinal direction and contained in the plane of FIG. 1. The longitudinal and transverse directions are respectively symbolized by an axis Z and an axis X in FIG. 1.

Furthermore, when the term "index" is used for a medium, that term refers to the refraction index of that medium, which is a property without characteristic dimension of that medium and describing the behavior of the light in that medium. In the event the medium has an index gradient, the term "index" refers to the mean of the index in that medium.

FIG. 1 shows an optical coupler 10, including a first waveguide 12, a second waveguide 14 and an insulating element 16. The optical coupler 10 also comprises a substrate 18 in which the second waveguide 14 is buried, the first waveguide 12 resting on the substrate 18.

The optical coupler 10 is capable of coupling light from the first waveguide 12 toward the second waveguide 14.

Hereinafter, "vertical configuration" refers to a configuration in which the optical coupler is capable of coupling light between two guides offset in the transverse direction X. Conversely, "horizontal configuration" refers to a configuration in which the optical coupler is capable of coupling light between two guides aligned along the transverse direction X. In the example of FIG. 1, the optical coupler 10 is in a vertical configuration.

The first waveguide 12 extends in the longitudinal direction Z between a first entry plane 12e and a first exit plane 12s. Each first plane 12e and 12s is a plane perpendicular to the longitudinal direction Z.

The first waveguide 12 includes a first core 22 and a first cladding 24.

The first core 22 is formed by a layer extending along the longitudinal direction Z. The first core 22 has a dimension e22 along the transverse direction X of 1.5 microns (μm) and a dimension l22 along the longitudinal direction Z may be several millimeters, but its dimension along a coupling zone defined by the overlap with the second core 30 is typically approximately 100 μm.

The first core 22 is, for example, a hetero structure made from a first material that is a mixture made up of Arsenic, Indium and Aluminum (with formula AlInAs) and a second material that is a mixture made up of Arsenic, Indium and Gallium (with formula GaInAs). Hereinafter, the index nc1 of the first core 22 is equal to 3.3, which mathematically translates to nc1=3.3.

More generally, the first core 22 is made from a gain material, i.e., a material capable of generating the stimulated emission of photons following an excitation.

The first cladding 24 has a first upper layer 26 and a first lower layer 28, the first core 22 being arranged between the first upper layer 26 and the first lower layer 28.

The first upper layer 26 has a dimension e26 along the transverse direction X of 1 μm and a dimension l26 along the longitudinal direction Z of approximately 100 μm.

The first lower layer 28 has a dimension e28 along the transverse direction X of 0.5 μm and a dimension l28 along the longitudinal direction Z of approximately 100 μm.

According to the example of FIG. 1, the first upper layer 26 and the first lower layer 28 are made from the same material. This material is the material from which the first cladding 24 is made.

In the illustrated case, the material is indium phosphorus.

Alternatively, the first upper layer 26 and the first lower layer 28 are made from two different materials.

The index ng1 of the first cladding 24 is then equal to 3.1, which mathematically translates to ng1=3.1.

The first waveguide 12 forms an active waveguide. "Active waveguide" refers to a waveguide including at least one layer formed from an active material capable of generating a wave. In the case of FIG. 1, the first core 22 is such a layer.

More specifically, the first waveguide 12 is a laser waveguide, i.e., a laser source. The first waveguide 12 is for example a so-called quantum cascade laser source (more often designated using its acronym, QCL). Such a waveguide 12 is capable of generating laser waves with a wavelength of 4.5 μm.

The first waveguide 12 is capable of propagating the waves according to a first propagation mode P1 corresponding to a first effective index NF1. In fact, depending on the field distribution, each propagation mode sees a different index of the materials making up the waveguide depending on each propagation mode. The index seen by each propagation mode defines the effective index. In the present case, the first effective index NF1 is equal to 3.21.

The second waveguide 14 extends in the longitudinal direction Z between a second entry plane 14*e* and a second exit plane 14*s*. Each second plane 14*e* and 14*s* is a plane perpendicular to the longitudinal direction Z. The second entry plane 14*e* is positioned between the first entry plane 12*e* and the first exit plane 12*s*.

The second waveguide 14 includes a second core 30, a second cladding 32 and a patterning 33.

The second core 30 is formed by a layer extending along the longitudinal direction Z. The second core 30 has a dimension e30 along the transverse direction X of 1.5 μm and a dimension l30 along the longitudinal direction Z is several millimeters. However, its dimension along the longitudinal direction Z along the overlap zone with the first core is approximately 100 μm.

The second core 30 is for example made from silicon-germanium. As a result, the index nc2 of the second core 30 is equal to 3.6, which mathematically translates to nc2=3.6.

The second cladding 32 includes a second upper layer 34 and a second lower layer combined with the substrate 18.

Alternatively, the second cladding 32 comprises a second lower layer distinct from the substrate 18.

The second upper layer 34 has a dimension e34 along the transverse direction X of 0.75 μm and a dimension l34 along the longitudinal direction Z can be several millimeters or centimeters. However, its dimension along the longitudinal direction along the coupling zone defined by the overlap with the second core 30 is approximately 100 μm.

The second cladding 32 is for example made from silicon. The index ng2 of the second cladding 32 is then equal to 3.4, which mathematically translates to ng2=3.4.

The second waveguide 14 is a passive waveguide, i.e., a waveguide not including a layer made from an active material.

The second waveguide 14 is capable of allowing the propagation of a second propagation mode denoted P2 corresponding to a second effective index NF2. In the absence of the patterning 33, the second effective index NF2 is greater than the first effective index NF1. In that case, the second effective index NF2 is equal to 3.51, which mathematically translates to NF2=3.51.

Alternatively, the first waveguide 12 has a first effective index NF1 greater than the second effective index NF2. Only the case where the first effective index NF1 is below the second effective index NF2 is considered, the transposition being easy for one skilled in the art.

The second waveguide 14 is buried in the substrate 18, i.e., it is optically insulated from the surrounding medium.

The insulating element 16 is, according to the example of FIG. 1, an optical insulating element assuming the form of a parallelepiped element. In the cross-sectional view of FIG. 1, it extends along the longitudinal direction Z between the first entry plane 12*e* and the second entry plane 14*e*.

The insulating element 16 is made from a material with an index lower than the effective index NF1 of the first waveguide 12.

Using the insulating element 16 makes it possible to avoid evanescent wave coupling between the first waveguide 12 and the substrate 18.

The substrate 18 is formed by a layer extending along the longitudinal direction Z extending between an entry plane 18*e* and an exit plane 18*f*. According to the example of FIG. 1, the second exit plane 14*s* is situated between the first exit plane 12*s* and the exit plane 18*f* of the substrate 18, while the first entry plane 12*e* is between the entry plane 18*e* of the substrate 18 and the first exit plane 12*s*.

The substrate 18 has a dimension e18 along the transverse direction X in the vicinity of several hundred μm thick, for example 700 μm, and a dimension l18 along the longitudinal direction Z several tens of centimeters wide.

The substrate 18 is for example made from silicon. The index ns18 of the substrate 18 is then equal to 3.4, which mathematically translates to ns18=3.4.

The patterning 33 is a series of blades 36.

Each blade 36 extends in a transverse direction X.

According to the example of FIG. 1, each blade 36 assumes the form of a rhomb.

Each blade 36 is parallel to the other blades 36.

Each blade 36 is arranged both in the second core 30 and in the second cladding 32 and in the substrate 18.

Each blade 36 has a dimension l36 along the transverse direction X and a dimension e36 along the longitudinal direction Z.

The patterning 33 has a spacing e between the blades 36 along the longitudinal direction Z.

The patterning 33 also has a fill factor corresponding to the ratio between the dimension e36 along the longitudinal direction Z and the sum of the dimension e36 along the longitudinal direction Z and the spacing e between the blades 36 along the longitudinal direction Z.

The index of the material from which the blades 36 are made is denoted n36. The index n36 of the blades 36 is below the effective index NF1 of the first waveguide 16.

It appears that the patterning 33 is characterized by a plurality of parameters that are, for the spacing e between the blades 36 along the transverse direction X, the fill factor and the index of the material from which the blades 36 are made. The parameters that characterize the patterning 33 are parameters influencing the coupling between the first waveguide 12 and the second waveguide 14.

Alternatively, other parameters are used to characterize the patterning 33. In particular, a linear combination of the preceding parameters is interesting.

As an example, instead of using the aforementioned dimension, a plurality of dimensions are used, namely the dimension of the blades 36 in the second upper layer 34 along the transverse direction X, the dimension of the blades 36 in the second core 30 along the transverse direction X, and the dimension of the blades 36 in the second lower layer along the transverse direction X.

According to one alternative, instead of the fill factor, the dimension along the longitudinal direction Z of the blades 36 is used.

The parameters characterizing each blade 36 verify a first property denoted P1. The first property P1 is verified when the evanescent wave coupling between the first waveguide 12 and the second waveguide 14 is greater than 15%. As a reminder, in the context of the invention, it is chosen to express the coupling as the ratio between the intensity of the electric field of the wave circulating in the second waveguide 14 and the sum of the intensities of the electric fields of the waves circulating in the first waveguide 12 and the second waveguide 14. Hereinafter, the coupling thus defined is denoted "C", which is a number with no unit.

In a manner known in itself, for an imposed evanescent wave coupling, one skilled in the art is capable of determining a second waveguide equivalent to the first waveguide 14 provided with the patterning 33. Determining the missing parameters of the patterning 33 therefore amounts to determining the optimal characteristics of the second equivalent waveguide. The effective index of the mode of the waveguide 14 provided with the structuring 33 is then of the first order given by the relationship:

$$NF2 = F*n36 + (1-F)*NF2'$$

where:
F is the fill factor of the patterning 33.
NF2' is the effective index of the propagation mode of the waveguide 14 without patterning (without patterning 33).

However, the optimization of the evanescent wave coupling between two waveguides is a known problem that one skilled in the art knows how to resolve. In fact, the transfer of light from one waveguide to another waveguide implies that the guided propagation modes of each guide are close enough to each other for their evanescent part to have a non-zero overlap. The optimal coupling length then depends on this overlap, which in turn depends on optogeometric characteristics of the considered waveguides.

For example, it is known from the book entitled *Optical wave guide theory* by A. W. Sneider and J. D. Love, published by Chapman and Hall in 1983, that for two waveguides A and B close enough for the evanescent part of the propagation modes of the waves circulating in those two guides to overlap, the length $L_C$ corresponding to the maximum coupling from the waveguide A toward the waveguide B to the other may be written:

$$Lc = \frac{\pi}{\sqrt{K^2 + \delta^2}}$$

Where:

$$\delta = \frac{\pi}{\lambda}(n_{effA} - n_{effB})$$

where
$\lambda$ is the length in the vacuum,
$n_{effA}$ is the effective index of the considered propagation mode circulating in the waveguide A, and
$n_{effB}$ is the effective index of the considered propagation mode circulating in the waveguide B, $$K = \sqrt{\frac{\varepsilon_0}{\mu_0}} \frac{k}{4} \int_{S_B} \Delta(n^2) E_a E_b^* \, dA$$

where
$\varepsilon_0$ is the dielectric permeability in the vacuum,
$\mu_0$ is the magnetic permeability in the vacuum,
k is the number of waves associated with the wavelength $\lambda$,
$\Delta(n^2)$ is the squared index difference between the index of the core of the waveguide B and the index of the cladding of the waveguide A,
$E_a$ is the electric field of the considered propagation mode in the waveguide A,
$E_b$ is the electric field of the considered propagation mode in the waveguide B,
"*" designates the mathematical conjugation operation, and
$S_B$ is the core section of the waveguide of B.

In order to perform the calculations, one skilled in the art usually uses digital simulation tools in particular to calculate the fields of the propagation modes of the waveguides A and B.

Thus, one skilled in the art manages to obtain the characteristics of the patterning 33. Implementing such an optimization leads, in the case of FIG. 1, for example, to the following choice.

Furthermore, each pattern 36 is arranged both in the core 30 and in the cladding 32 of the second waveguide 14.

According to the example of FIG. 1, each blade 36 extends from the second upper layer 34 while passing through all of the second core 30 as far as the second lower layer. More specifically, each blade 36 has a same dimension l36 of 3 µm in the transverse direction X, distributed in 0.75 µm in the second upper layer 34, 1.5 microns in the second core 30 and 0.75 µm in the second lower layer.

As a result, the blades 36 are in contact with the first lower layer 28.

The blades 36 are made from silicon oxide (with chemical formula $SiO_2$). The index n36 of the blades 36 then reaches 1.5, which automatically translates to n36=1.5. The index n36 of the blades 36 is below the effective index NF1 of the first waveguide 16.

The patterning 33 has a spacing e between the blades 36 such that the period P of the patterning 33, i.e., the sum of the spacing e and the thickness of the blade e36, is less than or equal to the ratio of the working wavelength of the optical coupler and the product of two by the second effective index NF2. The spacing between the blades 36 is the distance separating two blades 36 along the longitudinal direction Z. This mathematically translates to:

$$P = e + e36 \leq \frac{\lambda}{2NF2}$$

The simulations done by the applicant have shown that the shorter the period P is, the better the coupling is.

According to the example of FIG. 1, the period P between the blades is strictly less than 0.65 µm.

Preferably, the fill factor is comprised between 10 and 30%.

In the example of FIG. 1, the fill factor is 14%.

The operation of the optical coupler 10 according to the invention will now be described.

When the first waveguide 12 is supplied with power, the first waveguide 12 emits light in the form of waves guided in the first core 22.

Part of the waves guided in the first core 22 then couples with the second waveguide 16 by evanescent waves. Waves are then guided in the second core 30.

The patterning 33 makes it possible to perform an adaptation of the effective index favoring the coupling between the first waveguide 12 and the second waveguide 16.

Figure 2:
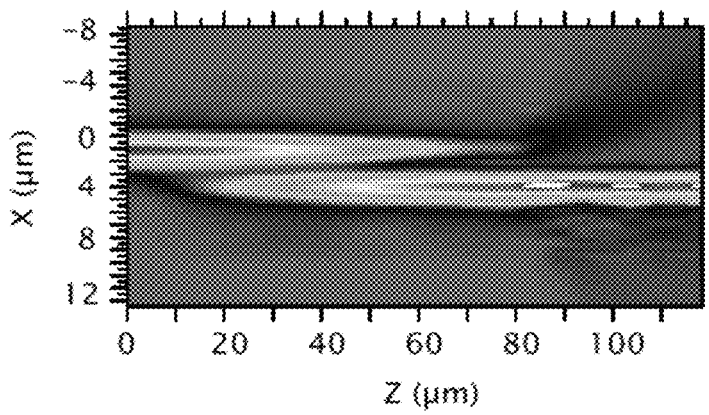
Figure 3:
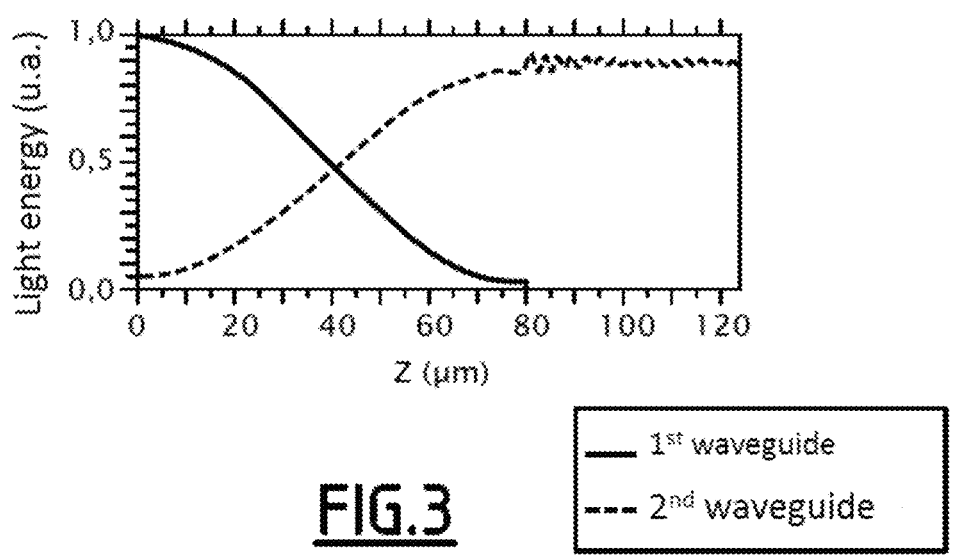

FIGS. 2 and 3 are simulations showing the distribution of the light energy in the optical coupler 10 according to FIG. 1. Upon observing FIG. 3, it appears that on the entry plane 12e of the first waveguide 12, the intensity of the electric field is 100%, whereas on the exit plane 12s of the second waveguide 14, the intensity of the electric field is 80%, which shows that the coupling C is approximately 80%.

This shows that the parameters chosen for the coupler 10 of FIG. 1, i.e., for each of the three layers (third core 26, upper layer 40 and lower layer 42), the dimension along the longitudinal direction Z of the considered player, the dimension along the transverse direction X of the considered layer and the optical index in which the considered layer is made, verify the property P1.

The coupling C obtained upon studying FIG. 3 should be compared to the coupling obtained with an optical coupler according to the state of the art.

Such an optical coupler according to the state of the art is a coupler representing the same characteristics, but without patterning.

Figure 4:
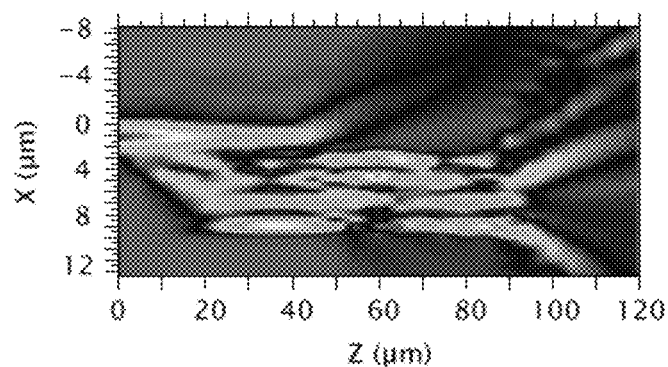
Figure 5:
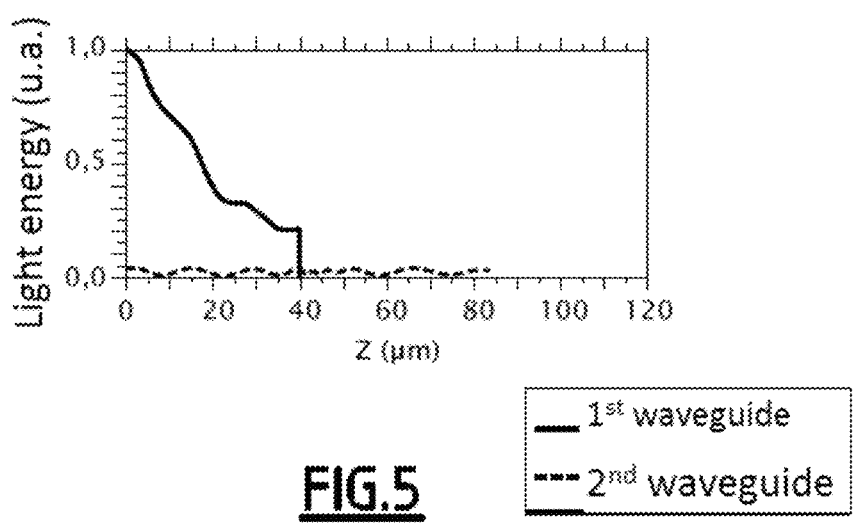

In that case, FIGS. 4 and 5 are obtained by simulation. Upon studying FIG. 5, it is observed that the coupling C is low, approximately 5%. In other words, using the coupler 10 according to the invention makes it possible to obtain a gain by a factor 16 in terms of coupling.

The optical coupler 10 according to the invention therefore makes it possible, owing to the presence of the patterning 33, to perform an effective index adaptation making it possible to ensure a transition from a first propagation mode P1 to a second propagation mode P2 of better quality than in the state of the art. This leads to increasing the observed coupling C.

This better coupling is obtained while preserving easy manufacturing. To illustrate this advantage, it is now described in reference to FIGS. 6 to 11.

As appears upon studying the values of the example of FIG. 1, in the absence of the third waveguide 14, since the index ng2 of the second gain is greater than the index nc1 of the first core 20, the coupling is physically impossible. The introduction of the third waveguide 14 makes it possible, for each waveguide, for the index of the cladding of the waveguide to be below the indices of the core(s) of each adjacent waveguide.

The manufacturing method first includes the deposition of a silicon substrate 18. For example, the deposition step 102 is for example implemented using a technique known in itself for chemical vapor deposition (CVD) or physical vapor deposition (PVD). The obtained substrate layer 18 is diagrammatically illustrated in FIG. 6.

The manufacturing method next includes manufacturing a silicon and germanium layer 100 on the silicon substrate 18. According to the proposed example, the manufacturing is implemented using silicon and crystalline germanium epitaxy. Epitaxy is an ordered growth technique of two materials (in this case, silicon and germanium) relative to one another that have a certain number of shared symmetrical elements in their crystalline networks. The assembly of the substrate layer 18 and the silicon and germanium layer 100 obtained at the end of this step of the method is diagrammatically illustrated in FIG. 7.

The method next comprises a lithography step done in the silicon-germanium layer so as to cut out a part of the layer 100 to obtain a layer forming the second core 30 of the second waveguide 14. The assembly of the substrate layer 18 and the second core 30 obtained at the end of this step of the method is diagrammatically illustrated in FIG. 8.

The method subsequently includes a step for manufacturing a silicon layer so as to form the upper layer 32 of the second waveguide 14. This manufacturing step successively includes an epitaxy step of the layer and polishing step of the layer in order to flatten the surface. According to the illustrated method example, the polishing step is carried out using a chemical mechanical polishing (CMP) technique. The assembly of the substrate 18 and the second waveguide 14 obtained at the end of this step of the method is diagrammatically illustrated in FIG. 9.

The method next includes a step for manufacturing the patterning 33 comprising a lithography sub-step making it possible to produce holes in the second waveguide 14, those holes next being filled with the material forming the blades 36, in this case silicon oxide. The lithography sub-step is followed by a new polishing sub-step. The assembly of the substrate 18 and the second waveguide 14 provided with the patterning 33 obtained at the end of this step of the method is directly illustrated in FIG. 10.

The method lastly includes a step for gluing the first waveguide 12, the result of which is illustrated by FIG. 11. The gluing step may be gluing by molecular adhesion. It is also possible to perform gluing by simple epitaxy (thin layers), then produce the waveguides 12 using techniques similar to those used for the waveguide 14.

The method therefore makes it possible to obtain the optical coupler 10. Implementing this method involves only the use of proven technologies in the context of the manufacture of planar components, and more particularly components made from a semiconductor material. In particular, such a manufacturing method does not involve implementing a technology for immersion in molten salt baths, which is a delicate technology to carry out. As a result, the method according to the invention is particularly easy to implement.

Furthermore, the optical coupler 10 has the advantage of not imposing constraints on the shape of the first waveguide 12 and the second waveguide 14. The first waveguide 12 and the second waveguide 14 can therefore be optimized to provide an optimal output (ratio between the output power of the considered device and the incident power on the considered device) without deteriorating the coupling C.

Alternatively, it should be noted that it is possible to design multiple optical couplers 10 whereof the parameters of the patterning 33 verify the property P1 relative to the coupling C.

In particular, different materials can be considered to produce the patterning 33. In particular, semiconductor materials of type "III-V" can be considered.

These remarks on the materials apply to the materials of all of the layers involved in the coupler 10.

As an illustration, a coupler 10 according to a second embodiment is considered. The identical elements between the coupler 10 according to the second embodiment and the coupler 10 according to the first embodiment are not repeated. Only the differences are highlighted.

In that case, the blades 36 are made from zinc sulfide (with chemical formula ZnS). The index n36 in this case is equal to 2.25, which mathematically translates to n36=2.25. Furthermore, the fill factor is 23%.

FIGS. 12 and 13 are simulations showing the distribution of the light energy in the optical coupler 10 according to the second embodiment. Upon observing FIG. 13, it appears that the intensity of the electric field is 100% in the entry plane 12e of the first waveguide 12, while in the exit plane 14s of the second waveguide 14, the intensity of the electric field is 80%, which shows that the coupling C is approximately 80%.

This example also illustrates that preferably, to obtain the best coupling, the parameters characterizing the patterning 33 alternatively verify a second property denoted P2. The second property P2 is verified when the evanescent wave coupling C between the first waveguide 12 and the second waveguide 14 is greater than 30%.

Still more advantageously, alternatively, the parameters characterizing the patterning 33 verify a third property denoted P3. The third property P3 is verified when the evanescent wave coupling C between the first waveguide 12 and the second waveguide 14 is greater than 50%.

Figure 14:
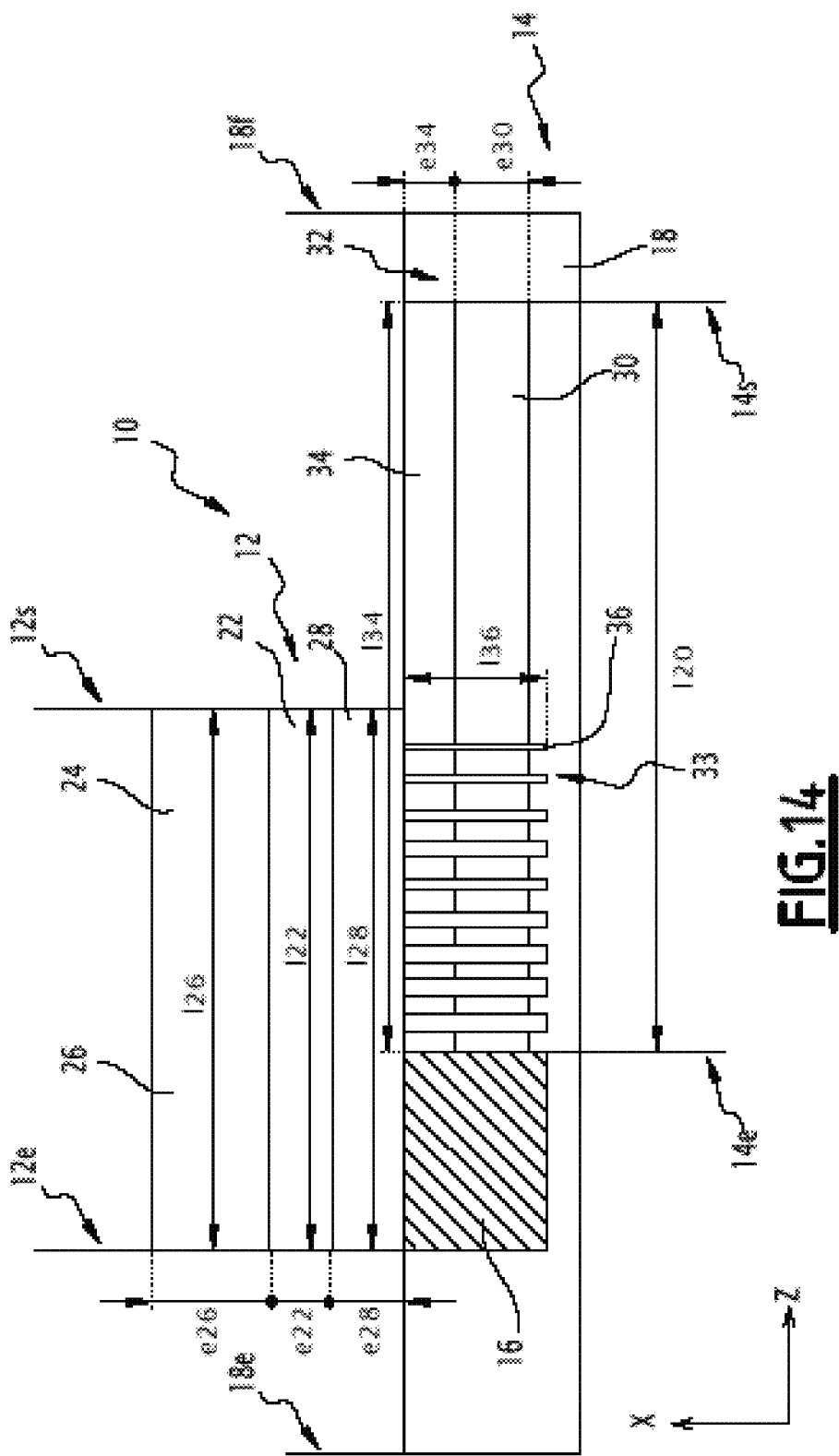

Other, more complex patterns are also advantageous for the optical coupler 10. FIGS. 14 and 15 illustrate two examples of this.

FIG. 14 shows an optical coupler 10 according to a third embodiment. The elements that are identical between the third embodiment and the coupler 10 according to the first embodiment are not repeated. Only the differences are highlighted.

In this third embodiment, the dimension e36 along the longitudinal direction Z of each blade varies. More specifically, depending on the propagation direction of the light, the dimension e36 along the longitudinal direction Z of a blade is smaller than the dimension e36 along the longitudinal direction Z of the preceding blade.

This makes it possible to obtain a patterning 33 ensuring adiabatic coupling of the waves. As a result, the fill factor goes from a minimum value to a maximum value, passing through the resonant coupling value mentioned in the previous embodiment. If this variation is slow enough, optimal coupling is obtained, equivalent to that of the coupling by the periodic patterning of the preceding embodiment. The primary interest lies in the robustness to technological imperfections. In fact, for a very specific targeted fill factor, it is possible that the technological patterning 33 manufacturing may not be perfect, which causes the coupling to be poor. With a fill factor gradient, while therefore being sure to go through the proper value, the coupling is then ensured.

FIG. 15 shows an optical coupler 10 according to a fourth embodiment. The elements that are identical between the coupler 10 according to the fourth embodiment and the coupler 10 according to the third embodiment are not repeated. Only the differences are highlighted.

In the case of FIG. 15, it is assumed that the heat conductivity of the material from which the insulating element 16 is made is lower than that of the substrate 18. In order to improve the heat conductivity, it is proposed that the insulating element 16 be provided with openings or assume the form of blades like the patterning 33 to benefit from the best heat release properties for the substrate 18.

According to other alternatives, it is also possible to consider more complex patterns. As an example, the optical coupler 10 includes a third waveguide distinct from the first and second waveguides 12, 14 and extending parallel to the first and second wave guides 12, 14, the third waveguide being arranged between the first waveguide 12 and the second waveguide 14 and be capable of propagating a third light propagation mode P3 having a third effective index NF3.

In that case, all of the parameters characterizing the third waveguide and the patterning 33 are such that the evanescent wave coupling between the first waveguide 12 and the second waveguide 14 is greater than 15% (30%, 50%, respectively, depending on the selected property).

Due to the multiplicity of the optical couplers 10 meeting properties P1, P2 or P3, it is also proposed, in the context of this invention, to have a method for determining parameters including a step for choosing parameters such that the coupling C is greater than 15%, 30% or 50%.

The optical coupler 10 obtained is in particular especially interesting in the case of an integrated gas sensor. More generally, such an optical coupler 10 can be used in any optical component for which it is favorable to implement a heterogeneous integration.

It should also be noted that the optical coupler 10 is also applicable in the case where the first waveguide 12 is not an active waveguide. As an example, the first waveguide 12 is an infrared detector comprising an absorbing material at the wavelength of interest with a waveguide 14 that is transparent at that same wavelength of interest. Thus, the guide 12 detects the light coming from the guide 14 in the opposite direction.

The proposed optical coupler 10 especially pertains to the field of the middle infrared.

"Middle infrared" refers to a spectral band grouping together waves whereof the wavelength is comprised between 2 μm and 10 μm.

Preferably, the preceding spectral band is limited to the band comprised between 2 μm and 7 μm, in particular if $SiO_2$ is used, since $SiO_2$ has a high absorption for radiations whereof the wavelength is greater than 7 μm.

In particular, in the case where the second waveguide is made from a Si (cladding)/SiGe (core) or SiGe (cladding)/Ge (core), a leak problem of the laser field appears once the index nc1 of the first core 22 is below the optical index ng2 of the second cladding 32. The patterning 33 makes it possible to limit that leak.

It should be noted that for a radiation below 2 µm, the leak problem is generally absent, since the index nc1 of the first core 22 is greater than the optical index ng2 of the second cladding 32.

Furthermore, it should also be noted that the coupling zone of the coupler 10 has an effective index.

When the effective index of the coupling zone of the coupler 10 is constant, the effective index of the coupling zone is such that the optical index of the second cladding with patterning 33 is below the first effective index NF1 (to avoid the leak of the mode in the cladding). Thus, the optical index of the coupling zone is, for example, below or preferably equal to the first effective index NF1.

When the effective index of the coupling zone is not constant, the effective index varies gradually from a value below or equal to the first effective index NF1 to a value equal to the second effective index NF1. In the coupling zone, the condition according to which the optical index of the second cladding with patterning 33 is below the first effective index NF1 is respected to prevent the mode from leaking in the cladding. Beyond the coupling zone, the light that is propagating is essentially contained in one or more modes guided by the second waveguide. As a result, the condition according to which the optical index of the second cladding with patterning 33 is below the first effective index NF1 can no longer be respected, and that non-respect does not cause a leak.

The invention claimed is:

1. An optical coupler in a vertical configuration, capable of working for a wavelength, wherein said optical coupler comprises:
   a first waveguide extending in the longitudinal direction and capable of propagating a first propagation mode of the light having a first effective index, an entry plane, and an exit plane being defined for the first waveguide,
   a second waveguide distinct from the first waveguide, parallel to the first waveguide, having a core and a cladding and capable of propagating a second propagation mode of the light having a second effective index, the second effective index being different from the first effective index, an entry plane, and an exit plane being defined for the second waveguide, the entry plane of the first waveguide being situated between the entry plane of the second waveguide and the exit plane of the second waveguide,
   the second waveguide having a patterning, the patterning having a period along the longitudinal direction below the ratio between the wavelength at which the optical coupler is capable of operating and the product of two by the second effective index, the patterning being in the form of a series of patterns, the patterns extending along a transverse direction perpendicular to the longitudinal direction, being parallel to each other and orthogonal to the general direction of the first waveguide, each pattern having parameters influencing the evanescent wave coupling between the first waveguide and the second waveguide so that the coupling is determined by a ratio between an intensity of an electrical field at the entry plane of the first waveguide and an intensity of an electrical field at the exit plane of the second waveguide and is greater than 15%,
   wherein the patterns have a dimension along the transverse direction larger than the dimension of the core of the second waveguide along the transverse direction.

2. The optical coupler according to claim 1, wherein the patterns are selected from the group consisting of:
   openings made in the second waveguide, and blades.

3. The optical coupler according to claim 1, wherein the core of the second waveguide having an optical index, the second effective index is greater than the first effective index and the patterns are made from a material having an optical index below the optical index of the core of the second waveguide.

4. The optical coupler according to claim 1, wherein the patterning has a fill factor, the patterns are made from a material having an optical index, the parameters influencing the evanescent wave coupling between the first waveguide and the second waveguide being the fill factor of the patterning, the optical index of the material from which the patterns are made, and the spacing along the longitudinal direction between each pattern.

5. The optical coupler according to claim 1, wherein each waveguide includes a cladding and a core, the optical index of the core of the first waveguide being below the optical index of the cladding of the second waveguide.

6. The optical coupler according to claim 1, wherein the first waveguide includes a core made from a material belonging to column III of the periodic table formed with a material from column V of the periodic table and two lower and upper layers surrounding the core.

7. The optical coupler according to claim 1, wherein the optical coupler includes a substrate, made from a first material, in which the second waveguide is buried, the first waveguide being arranged in contact with the substrate and formed from a material different from the first material.

8. The optical coupler according to claim 1, wherein the optical coupler includes a third waveguide distinct from the first and second waveguides and extending parallel to the first and second waveguides, the third waveguide being arranged between the first waveguide and the second waveguide and being capable of propagating a third light propagation mode having a third effective index.

9. The optical coupler according to claim 1, including a thermal insulation zone of the first waveguide in which the patterning is arranged.

10. An optical component comprising an optical coupler according to claim 1.

11. An optical coupler in a vertical configuration, capable of working for a wavelength, wherein said optical coupler comprises:
   a first waveguide extending in the longitudinal direction and capable of propagating a first propagation mode of the light having a first effective index, an entry plane, and an exit plane being defined for the first waveguide,
   a second waveguide distinct from the first waveguide, parallel to the first waveguide, having a core and a cladding and capable of propagating a second propagation mode of the light having a second effective index, the second effective index being different from the first effective index, an entry plane, and an exit plane being defined for the second waveguide, the entry plane of the first waveguide being situated between the entry plane of the second waveguide and the exit plane of the second waveguide,
   the second waveguide having a patterning, the patterning having a period along the longitudinal direction below the ratio between the wavelength at which the optical coupler is capable of operating and the product of two by the second effective index, the patterning being in the form of a series of patterns, the patterns extending along a transverse direction perpendicular to the longitudinal direction, being parallel to each other and orthogonal to the general direction of the first waveguide, each pattern having parameters influencing the evanescent wave coupling between the first waveguide and the second waveguide so that the coupling is determined by a ratio between an intensity of an electrical field at the entry plane of the first waveguide and an intensity of an electrical field at the exit plane of the second waveguide and is greater than 15%, wherein each pattern is arranged both in the core and the cladding of the second waveguide.

12. An optical coupler in a vertical configuration, capable of working for a wavelength, wherein said optical coupler comprises:

a first waveguide extending in the longitudinal direction and capable of propagating a first propagation mode of the light having a first effective index, an entry plane, and an exit plane being defined for the first waveguide, a second waveguide distinct from the first waveguide, parallel to the first waveguide, having a core and a cladding and capable of propagating a second propagation mode of the light having a second effective index, the second effective index being different from the first effective index, an entry plane, and an exit plane being defined for the second waveguide, the entry plane of the first waveguide being situated between the entry plane of the second waveguide and the exit plane of the second waveguide, the second waveguide having a patterning, the patterning having a period along the longitudinal direction below the ratio between the wavelength at which the optical coupler is capable of operating and the product of two by the second effective index, the patterning being in the form of a series of patterns, the patterns extending along a transverse direction perpendicular to the longitudinal direction, being parallel to each other and orthogonal to the general direction of the first waveguide, each pattern having parameters influencing the evanescent wave coupling between the first waveguide and the second waveguide so that the coupling is determined by a ratio between an intensity of an electrical field at the entry plane of the first waveguide and an intensity of an electrical field at the exit plane of the second waveguide and is greater than 15%, wherein the spacing along the longitudinal direction between the patterns is variable in the longitudinal direction.

13. An optical coupler in a vertical configuration, capable of working for a wavelength, wherein said optical coupler comprises:

a first waveguide extending in the longitudinal direction and capable of propagating a first propagation mode of the light having a first effective index, an entry plane, and an exit plane being defined for the first waveguide, a second waveguide distinct from the first waveguide, parallel to the first waveguide, having a core and a cladding and capable of propagating a second propagation mode of the light having a second effective index, the second effective index being different from the first effective index, an entry plane, and an exit plane being defined for the second waveguide, the entry plane of the first waveguide being situated between the entry plane of the second waveguide and the exit plane of the second waveguide, the second waveguide having a patterning, the patterning having a period along the longitudinal direction below the ratio between the wavelength at which the optical coupler is capable of operating and the product of two by the second effective index, the patterning being in the form of a series of patterns, the patterns extending along a transverse direction perpendicular to the longitudinal direction, being parallel to each other and orthogonal to the general direction of the first waveguide, each pattern having parameters influencing the evanescent wave coupling between the first waveguide and the second waveguide so that the coupling is determined by a ratio between an intensity of an electrical field at the entry plane of the first waveguide and an intensity of an electrical field at the exit plane of the second waveguide and is greater than 15%, wherein the core of the second waveguide has a variable dimension in the transverse direction.

\* \* \* \* \*